(12) United States Patent
Kim

(10) Patent No.: US 7,796,395 B2
(45) Date of Patent: Sep. 14, 2010

(54) HEAT DISSIPATION DEVICE FOR SEMICONDUCTOR PACKAGE MODULE, AND SEMICONDUCTOR PACKAGE MODULE HAVING THE SAME

(75) Inventor: Moon Su Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 15 days.

(21) Appl. No.: 12/244,975

(22) Filed: Oct. 3, 2008

(65) Prior Publication Data

US 2009/0168364 A1 Jul. 2, 2009

(30) Foreign Application Priority Data

Jan. 2, 2008 (KR) .................... 10-2008-0000292

(51) Int. Cl.
*H05K 7/20* (2006.01)
(52) U.S. Cl. ............... 361/721; 361/704; 361/719; 361/720; 257/713; 257/718; 174/252
(58) Field of Classification Search ............ 361/679.46, 361/704, 705, 710, 715, 717, 719, 797, 720, 361/721
See application file for complete search history.

(56) References Cited

U.S. PATENT DOCUMENTS

| | | | | |
|---|---|---|---|---|
| 5,208,732 A | * | 5/1993 | Baudouin et al. ........... | 361/704 |
| 5,825,633 A | * | 10/1998 | Bujalski et al. ............ | 361/804 |
| 6,356,448 B1 | * | 3/2002 | DiBene et al. ............. | 361/721 |
| 6,717,799 B2 | * | 4/2004 | Hamano et al. ......... | 361/679.54 |
| 6,941,537 B2 | * | 9/2005 | Jessep et al. .................. | 716/15 |
| 7,130,195 B2 | * | 10/2006 | Kawano et al. ............. | 361/719 |
| 2002/0008963 A1 | * | 1/2002 | DiBene et al. ............. | 361/720 |
| 2009/0185352 A1 | * | 7/2009 | Ellsworth et al. ........... | 361/720 |

FOREIGN PATENT DOCUMENTS

| | | |
|---|---|---|
| JP | 01-230260 A | 9/1989 |
| KR | 1020000006134 A | 1/2000 |
| KR | 10-0297226 B1 | 11/2001 |
| KR | 1020060122769 A | 11/2006 |

\* cited by examiner

*Primary Examiner*—Jayprakash N Gandhi
*Assistant Examiner*—Courtney Smith
(74) *Attorney, Agent, or Firm*—Ladas & Parry LLP

(57) ABSTRACT

A semiconductor package module having a heat dissipation device includes one or more semiconductor packages with each semiconductor package having semiconductor chips and solder balls connected to the semiconductor chips. A printed circuit board is electrically connected to each of the semiconductor packages. The heat dissipation device dissipates heat generated within the semiconductor package module and includes a fastening member having a fastening body. The fastening member is placed in the space between the semiconductor chips and the printed circuit board, which occurs due to the presence of the solder balls. A coupling groove is defined in an upper surface of the fastening body, and a heat dissipation member covers the semiconductor packages. A through-hole is defined in the heat dissipation member at a position corresponding to the coupling groove, and a coupling member is disposed within the through-hole and is coupled to the coupling groove.

15 Claims, 7 Drawing Sheets

HEAT DISSIPATION DEVICE FOR SEMICONDUCTOR PACKAGE MODULE, AND SEMICONDUCTOR PACKAGE MODULE HAVING THE SAME

CROSS-REFERENCE TO RELATED APPLICATIONS

The present application claims priority to Korean patent application number 10-2008-0000292 filed on Jan. 2, 2008, which is incorporated herein by reference in its entirety.

BACKGROUND OF THE INVENTION

The present invention relates generally to a heat dissipation device for a semiconductor package module and a semiconductor package module having the same, and more particularly to a heat dissipation device that can be mounted to a semiconductor package module having a small size.

Today's semiconductor packages include semiconductor devices capable of storing a huge amount of data and processing the data within a short time.

In a typical semiconductor package module a plurality of semiconductor packages are mounted to a printed circuit board, etc. The semiconductor package module is coupled to various devices (for example, a computer) in order to perform a variety of diverse functions.

In a semiconductor package module having a plurality of semiconductor packages, a substantial amount of heat is generated while processing data. The heat has a detrimental effect on the performance of the semiconductor packages included in the semiconductor package module. In order to account for the generation of heat, most semiconductor package modules have heat sinks for quickly dissipating the heat generated in the semiconductor packages and clips for fastening the heat sinks to the semiconductor package modules.

However, design trends in semiconductor technology call for a decrease in the size allotted to the semiconductor package modules. As a consequence, the space available for installing heat sinks on the semiconductor package modules has decreased making it difficult to appropriately install the heat sinks on the semiconductor package modules. The heat sinks are essential for improved performance of the semiconductor package modules, and thus this lack of space causes problems.

SUMMARY OF THE INVENTION

Embodiments of the present invention are directed to a heat dissipation device for a semiconductor package module, which can be mounted to a semiconductor package module even when the size of the semiconductor package module is small.

Additionally, embodiments of the present invention are directed to a semiconductor package module including the heat dissipation device.

In one aspect of the present invention, a heat dissipation device for a semiconductor package module comprises a fastening member having a fastening body which has the shape of a plate and a coupling groove which is defined in an upper surface of the fastening body; a heat dissipation member placed over the fastening member and having at least one through-hole; and a coupling member coupled in the coupling groove via the through-hole.

The fastening member may have the shape of rectangular hexahedron, and a pair of step portions is formed at side surfaces of the fastening member. Semiconductor chips are formed within the step portions of the fastening member so that the portion of the semiconductor chip formed within the step portion is interposed between the heat dissipation member and the fastening member.

The coupling member may be a locking screw.

A heat transfer layer formed of a material having excellent heat conductivity is located on an inner surface of the heat dissipation member, which faces the fastening member.

A plurality of heat dissipation fins are formed on a surface of the heat dissipation member.

In another aspect of the present invention, a semiconductor package module comprises at least two semiconductor packages having semiconductor chips and solder balls connected to the semiconductor chips; a printed circuit board having the at least two semiconductor packages electrically connected in parallel to one surface thereof; and a heat dissipation device including a fastening member having a fastening body which has the shape of a plate and is placed in a space between the semiconductor chips and the printed circuit board due to the presence of the solder balls and a coupling groove which is defined on an upper surface of the fastening body, a heat dissipation member placed to cover the semiconductor packages and defined with a through-hole at a position corresponding to the coupling groove, and a coupling member coupled into the coupling groove through the through-hole.

The coupling member may comprise a locking screw.

A receiving groove is defined in a lower surface of the fastening body which faces away from the upper surface and towards the printed circuit board to protect a passive component formed on the printed circuit board.

The fastening body is coupled to lower surfaces and side surfaces of the semiconductor chips.

A heat transfer layer formed of a material having excellent heat conductivity is interposed between the heat dissipation member and the semiconductor chips.

The heat dissipation member has a plurality of heat dissipation fins which are formed on a surface of the heat dissipation member.

The semiconductor package module may further comprise an additional semiconductor package placed on the opposite surface of the printed circuit board.

DESCRIPTION OF SPECIFIC EMBODIMENTS

Figure 1:
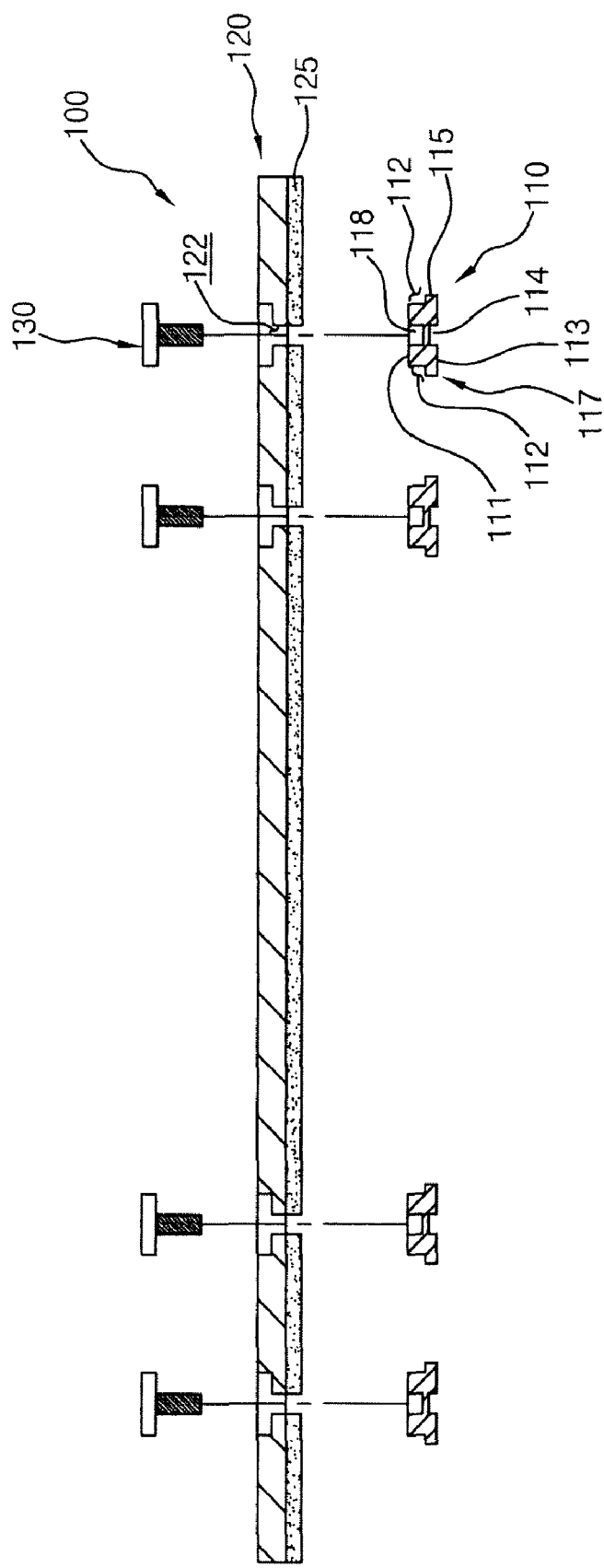
FIG. 1 is an exploded cross-sectional view showing a heat dissipation device for a semiconductor package module according to an embodiment of the present invention.
Figure 2:
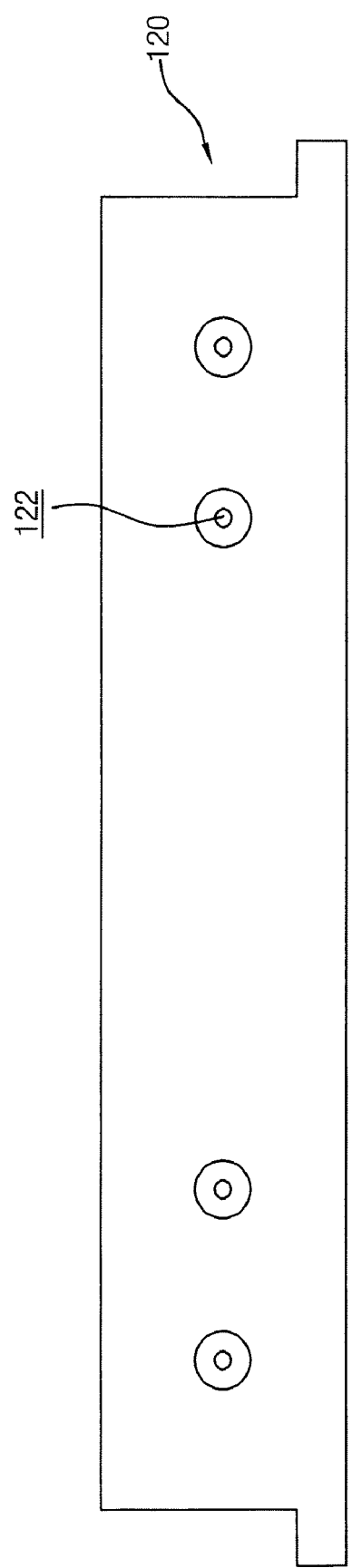
FIG. 2 is a plan view showing an embodiment of the heat dissipation member of FIG. 1.

FIG. 1 is an exploded cross-sectional view showing a heat dissipation device for a semiconductor package module according to an embodiment of the present invention. FIG. 2 is a plan view showing the heat dissipation member of FIG. 1.

Referring to FIGS. 1 and 2, a heat dissipation device 100 for a semiconductor package module includes fastening members 110, a heat dissipation member 120, and coupling members 130.

Each fastening member 110 has a fastening body 117 and a coupling groove 118. The fastening body 117 has, for example, the shape of a rectangular hexahedral plate. In one embodiment of the present invention, the fastening body 117 is made of a synthetic resin. Alternatively, the fastening body 117 can be made of a metal having excellent heat conductivity.

The fastening body 117 (which has the shape of a plate) possesses an upper surface 111, a lower surface 113 facing opposite the upper surface 111, and two side surfaces 115 which connect the upper surface 111 and the lower surface 112. The fastening body 117 also includes step portions 112 which are formed in the side surfaces 115.

The coupling groove 118 of the fastening member 110 is defined within the upper surface 111 of the fastening body 117. In one embodiment of the present invention, an internal thread is formed on the surface of the coupling groove 118.

The heat dissipation member 120 is placed, for example, on the fastening members 110. In one embodiment of the present invention (such as the one shown in FIG. 1), the heat dissipation member 120 has the shape of a rectangular hexahedral plate; however, the heat dissipation member 120 is not limited to this shape. The heat dissipation member 120 can be made of any metal having excellent heat conductivity. Some examples of material suitable for use as the heat dissipation member 120 include aluminum, aluminum alloy, brass, copper, and copper alloy.

One or more through-holes 122 are defined in the heat dissipation member 120. In the embodiment of the present invention shown in FIG. 1, a plurality of through-holes 122 is defined in the heat dissipation member 120.

A heat transfer layer 125 is located on the lower surface of the heat dissipation member 120 (i.e., the surface of the heat dissipation member 120 facing the fastening members 110). The heat transfer layer 125 can be made, for example, of a material having excellent heat conductivity.

Figure 3:
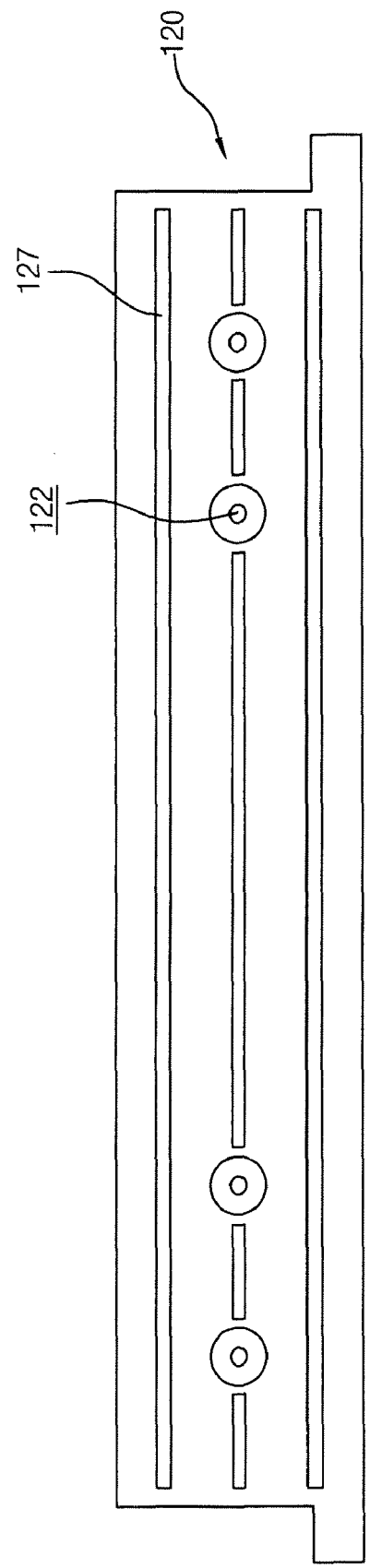
FIG. 3 is a plan view showing another embodiment of the heat dissipation member of FIG. 1.

FIG. 3 is a plan view showing a heat dissipation member according to another embodiment of the present invention.

Referring to FIG. 3, the heat dissipation member 120 may further comprise heat dissipation fins 127 formed on the surface of the heat dissipation member 120 in the shape of ribs. The heat dissipation fins 127 function to increase the heat dissipation area of the heat dissipation member 120 and improve the heat transfer performance thereof.

Referring to FIGS. 1-3, in embodiments of the present invention, the coupling members 130 may comprise locking screws. The coupling members 130 pass through the through-holes 122 of the heat dissipation member 120 and are threadedly locked in the coupling grooves 118 of the fastening members 110 (i.e., the coupling members are threadedly engaged and/or locked with the coupling grooves 118). The coupling members 130 comprising locking screw may also include screw heads and screw bodies. The screw heads of the coupling members 130 may have a diameter larger than the diameter of the screw bodies. As is shown in FIG. 1, the through-holes 122 may have an upper width and a lower width, with the upper width being larger than the lower width, such that the coupling members comprising locking screws fit securely and entirely within the through-holes 122 of the heat dissipation member 120.

The heat dissipation device described above with reference to FIGS. 1 through 3 can be applied to various semiconductor package modules, and is particularly useful in semiconductor package modules in which it is difficult to install heat sinks using clips, etc. due to the small size of the printed circuit board of the device.

Figure 4:
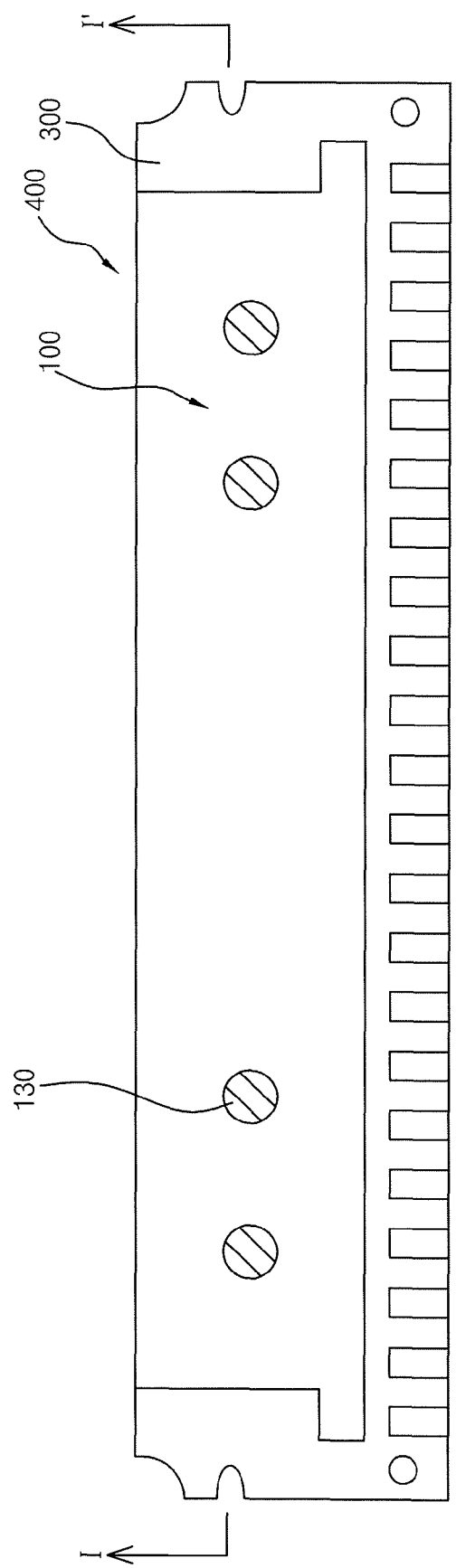
FIG. 4 is a plan view showing a semiconductor package module according to another embodiment of the present invention.
Figure 5:
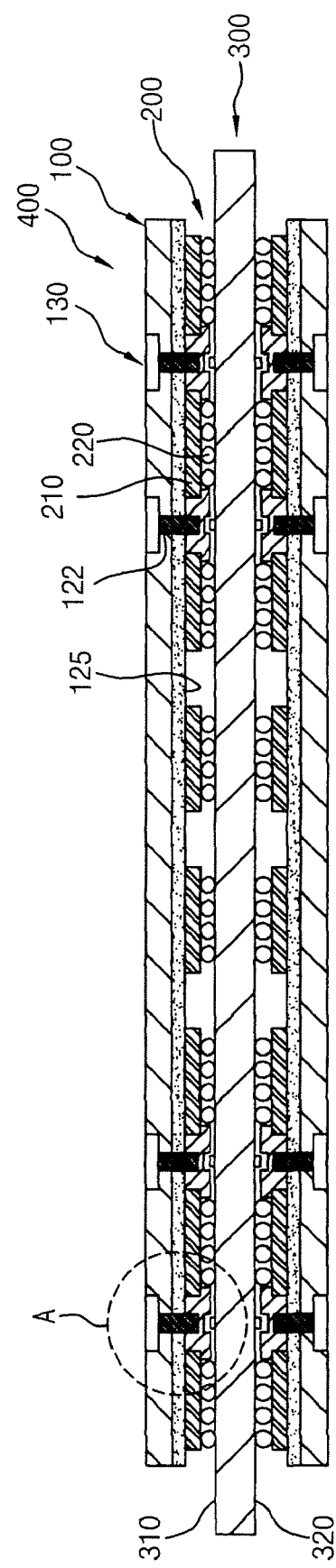
FIG. 5 is a cross-sectional view taken along the line I-I' of FIG. 4.
Figure 6:
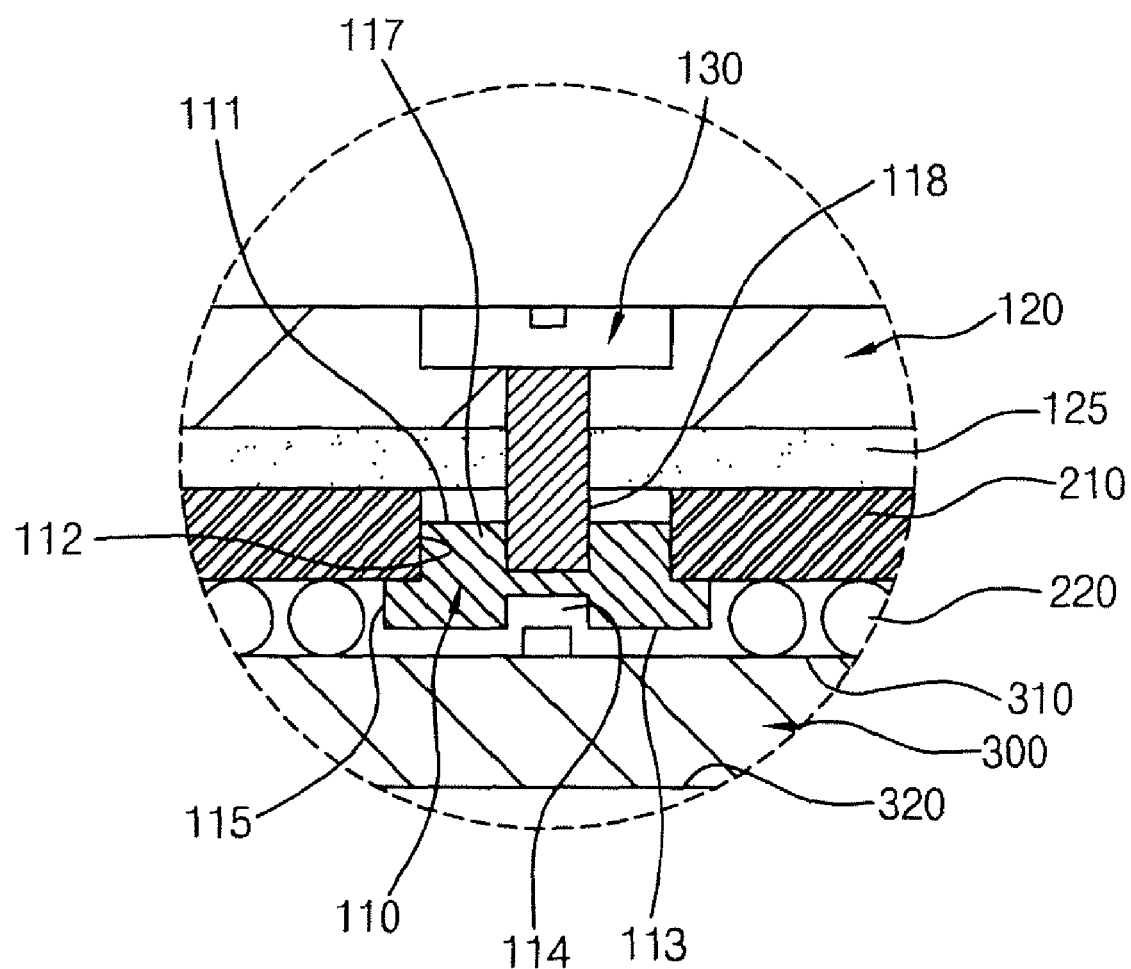
FIG. 6 is an enlarged view showing part 'A' of FIG. 5.

FIG. 4 is a plan view showing a semiconductor package module in accordance with another embodiment of the present invention. FIG. 5 is a cross-sectional view taken along the line I-I' of FIG. 4. FIG. 6 is an enlarged view showing part 'A' of FIG. 5.

Referring to FIGS. 4 through 6, a semiconductor package module 400 according to an embodiment of the present invention includes a plurality of semiconductor packages 200, a printed circuit board 300, and a plurality of heat dissipation devices 100.

Each semiconductor package 200 has a semiconductor chip 210 and solder balls 220.

In an embodiment of the present embodiment the semiconductor chips 210 may comprise wafer level semiconductor chips which include re-distribution lines having ball land patterns. Alternatively, the semiconductor chips 200 may comprise semiconductor chips and a sub circuit board to which the semiconductor chips are mounted and which has ball land patterns.

The solder balls 220 are electrically connected to the ball land patterns of the semiconductor chips 210.

In one embodiment of the present invention, the printed circuit board 300 has, for example, the shape of a rectangular hexahedral plate. In the embodiment of the present invention shown in FIG. 5, the semiconductor packages 200 are positioned in parallel on the printed circuit board 300.

The semiconductor packages 200 can be positioned in parallel on a first surface 310 of the printed circuit board 300 and/or a second surface 320 of the printed circuit board 300 which faces opposite the first surface 310.

The semiconductor packages 200 (which are positioned on the first surface 310 and/or the second surface 320 of the printed circuit board 300) are spaced apart from one another by a predetermined distance.

The lower surfaces of the semiconductor chips 210 of the semiconductor packages 200 (which are located on the first surface 310 and/or the second surface 320 of the printed circuit board 300) are separated from the first surface 310 and/or the second surface 320 of the printed circuit board 300 by a predetermined gap.

The heat dissipation devices 100 function to quickly dissipate the large amount of heat that is generated while the semiconductor packages 200 are operating at high speeds, such that the heat is transferred to outside the semiconductor package module 400, thereby improving the performance of the semiconductor package module 400.

In the present embodiment shown in FIGS. 4-6, the heat dissipation devices 100 are fastened by way of the semiconductor packages 200 which are connected to the printed circuit board 300.

Referring to FIGS. 5 and 6, each heat dissipation device 100 includes fastening members 110, a heat dissipation member 120 and coupling members 130.

The fastening members 110 are disposed such that separation occurs between the fastening members 110 and the printed circuit board 300 due to the solder balls 220 of the semiconductor packages 200.

Each fastening member 110 has a fastening body 117 and a coupling groove 118. The fastening body 117 has, for example, the shape of a rectangular hexahedral plate. In one embodiment of the present invention, the fastening body 117 can be made of a synthetic resin. Alternatively, the fastening body 117 can be made of a metal having excellent heat conductivity.

The fastening body 117 possesses an upper surface 111, a lower surface 113 facing opposite the upper surface 111, and two side surfaces 115 connecting the upper surface 111 to the lower surface 112. Also, the fastening body 117 has step portions 112 which are formed in the side surfaces 115.

The coupling groove 118 of the fastening member 110 is defined within the upper surface 111 of the fastening body 117. In one embodiment of the present invention, an internal thread is formed on the surface of the coupling groove 118. A receiving groove 114 may be defined within the lower surface 113 of the fastening member 110, and a passive component formed on the printed circuit board 300 can be received by the receiving groove 114.

The lower surfaces and the side surfaces of respective semiconductor chips 210 are seated on the step portions 112 of the fastening body 117.

The heat dissipation member 120 is placed, for example, on the semiconductor packages 200. In an embodiment of the present invention, the heat dissipation member 120 may have the shape of a rectangular hexahedral plate. The heat dissipation member 120 can be made of a metal having excellent heat conductivity. Some examples of material suitable for use as the heat dissipation member 120 include aluminum, aluminum alloy, brass, copper, and copper alloy.

One or more through-holes 122 are defined in the heat dissipation member 120. In the embodiment of the present invention shown in FIGS. 4-6, a plurality of through-holes 122 are defined in the heat dissipation member 120. The through-holes 122 are defined such that each through-hole 122 corresponds to one of the coupling grooves 118 of the fastening members 110. For example, in the embodiment shown in FIGS. 4-6, the center of each of the through-holes 122 is aligned with the center of the coupling groove 118 of the corresponding fastening member 110.

A heat transfer layer 125 is located on the lower surface of the heat dissipation member 120 (i.e., the heat transfer layer 124 is formed on the surface of the heat dissipation member 120 that faces the semiconductor chips 210). In an embodiment of the present invention, the heat transfer layer 125 is made of a material having excellent heat conductivity.

Figure 7:
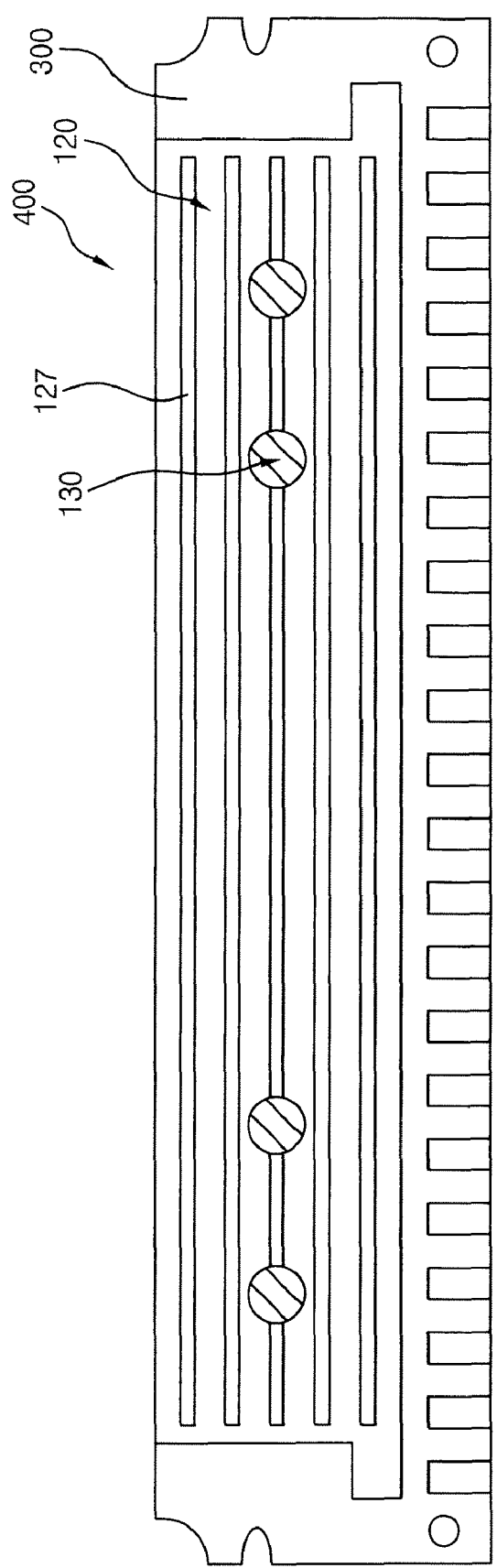
FIG. 7 is a plan view showing a semiconductor package module according to another embodiment of the present invention.

FIG. 7 is a plan view showing a semiconductor package module according to another embodiment of the present invention.

Referring to FIG. 7, in the semiconductor package module according to the present embodiment, the heat dissipation member 120 further comprises heat dissipation fins 127 formed on the surface of the heat dissipation member 120 in the shape of ribs. The heat dissipation fins 127 function to increase the heat dissipation area of the heat dissipation member 120 and improve the heat transfer performance thereof.

Additionally, in embodiments of the present invention, the coupling members 130 may comprise locking screws. When locking screws are utilized, the coupling members 130, which pass through the through-holes 122 of the heat dissipation, member 120 are threadedly locked in the coupling grooves 118 of the fastening members 110 (i.e., the coupling members are threadedly engaged and/or locked with the coupling grooves 118). The coupling members 130 comprising locking screw may also include screw heads and screw bodies. The screw heads of the coupling members 130 may have a diameter larger than the diameter of the screw bodies. As is shown in FIG. 1, the through-holes 122 may have an upper width and a lower width, such that the upper width being larger than the lower width, such that the coupling members comprising locking screws fit securely and entirely within the through-holes 122 of the heat dissipation member 120.

As is apparent from the above description, in an embodiment of the present invention a heat dissipation member can be mounted to semiconductor packages by defining a space between semiconductor chips and the printed circuit board. As such, the present invention can be utilized when it is difficult to install heat sinks through defining holes in a printed circuit board due to the small size of the printed circuit board.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A heat dissipation device for dissipating heat within a semiconductor package module, comprising:
    a fastening member having a fastening body and a coupling groove defined within an upper surface of the fastening body;
    a heat dissipation member disposed over the fastening member and having at least one through-hole; and
    a coupling member disposed within the through-hole and coupled to the coupling groove,
    wherein the fastening member further comprises one or more step portions each formed on a respective side surface of the fastening member, and
    wherein one or more semiconductor chips are disposed on a surface of the heat dissipation member and a portion of each of the semiconductor chips is formed within one of the step portions of the fastening member such that the portion of the semiconductor chip formed within the step portion is interposed between the heat dissipation member and the fastening member.

2. The heat dissipation device according claim 1, wherein the fastening member has the shape of a rectangular hexahedron.

3. The heat dissipation device according to claim 1, wherein the coupling member comprises a locking screw and the locking screw is threadedly engaged to the coupling groove of the fastening member.

4. The heat dissipation device according to claim 1, wherein a heat transfer layer formed of a heat conductive material is disposed on a surface of the heat dissipation member facing the fastening member.

5. The heat dissipation device according to claim 1, wherein a plurality of heat dissipation fins are formed on a surface of the heat dissipation member.

6. The heat dissipation device according to claim 5, wherein the heat dissipation fins are formed in the shape of ribs on a surface of the heat dissipation member.

7. The heat dissipation device according to claim 1, wherein the heat dissipation member comprises one of aluminum, an aluminum alloy, brass, copper, and a copper alloy.

8. A semiconductor package, module comprising:
    one or more semiconductor package each having a semiconductor chip and a plurality of connecting members connected to the semiconductor chip;
    a printed circuit board, wherein each of the one or more semiconductor packages is electrically connected to a surface of the printed circuit board by the respective plurality of connecting members, wherein each of the plurality of connecting members provides a space between the printed circuit board and the semiconductor chip of the respective semiconductor package; and a heat dissipation device dissipating heat generated within the semiconductor package module, wherein the heat dissipation device comprises:
a fastening member having a fastening body, at least a portion of the fastening member being disposed in the space between any of the semiconductor chips of the one or more semiconductor packages and the printed circuit board;
a coupling groove defined within an uppersurface of the fastening body;
a heat dissipation member disposed over the one or more semiconductor packages, the heat dissipation member comprising a through-hole defined at a position corresponding to the coupling groove, and
a coupling member disposed within the through-hole and coupled to coupling groove,
wherein the fastening body includes a step portion formed in a side surface of the fastening body, wherein a portion of one of the semiconductor chips is formed within the step portion of the fastening body such that the step of the fastening body is coupled to a lower surface and a side surface of the semiconductor chips.

9. The semiconductor package module according to claim 8, wherein the coupling member comprises a locking screw and the locking screw is threadedly engaged to the coupling groove of the fastening member.

10. The semiconductor package module according to claim 8, wherein a receiving groove is defined on a lower surface of the fastening body, wherein the lower surface is opposite the upper surface and facing the printed circuit board such that the receiving groove protects a passive component formed on the printed circuit board.

11. The semiconductor package module according to claim 8, wherein a heat transfer layer formed of a heat conductive material is interposed between the heat dissipation member and the semiconductor chips.

12. The semiconductor package module according to claim 8, wherein the heat dissipation member has a plurality of heat dissipation fins which are formed on a surface of the heat dissipation member.

13. The semiconductor package module according to claim 8, wherein the one are more semiconductor packages are first one or more semiconductor packages and the surface of the printed circuit board is a first surface, and wherein the semiconductor package module further comprises:
a second semiconductor package electrically connected to a second surface of the printed circuit board, the second surface facing the opposite direction of the first surface.

14. The semiconductor package module according to claim 8, wherein the center of the through-hole is aligned with the center of the coupling groove.

15. The semiconductor package module according to claim 8, the connecting members include solder ball.

* * * * *